(12) United States Patent
Su

(10) Patent No.: US 7,630,205 B2
(45) Date of Patent: Dec. 8, 2009

(54) DISASSEMBLING TOOL AND METHOD FOR DISASSEMBLING A CIRCUIT BOARD FROM A HOUSING, AND ASSEMBLY OF A CIRCUIT BOARD, A HOUSING AND THE DISASSEMBLING TOOL

(75) Inventor: Chien-An Su, Taipei Hsien (TW)

(73) Assignee: Wistron NeWeb Corp., Taipei Hsien (TW)

( * ) Notice: Subject to any disclaimer, the term of this patent is extended or adjusted under 35 U.S.C. 154(b) by 53 days.

(21) Appl. No.: 12/155,192

(22) Filed: May 30, 2008

(65) Prior Publication Data

US 2009/0151516 A1   Jun. 18, 2009

(30) Foreign Application Priority Data

Dec. 13, 2007   (TW) .............................. 96147665 A

(51) Int. Cl.
*H05K 5/00* (2006.01)
(52) U.S. Cl. ..................... 361/754; 361/752; 361/818
(58) Field of Classification Search ................. 361/600, 361/679, 752, 790, 797, 800, 816, 818; 439/259–260, 439/625–626, 629–630
See application file for complete search history.

(56) References Cited

U.S. PATENT DOCUMENTS

| | | | | |
|---|---|---|---|---|
| 3,576,515 A * | 4/1971 | Frantz | ......................... | 439/267 |
| 4,789,352 A * | 12/1988 | Kreinberg et al. | ............ | 439/260 |
| 5,162,980 A * | 11/1992 | Morgan et al. | .............. | 361/818 |
| 6,859,371 B2 * | 2/2005 | Huang | ......................... | 361/818 |
| 2006/0114604 A1 * | 6/2006 | Shimizu et al. | .......... | 360/99.04 |

* cited by examiner

*Primary Examiner*—Hung S Bui
(74) *Attorney, Agent, or Firm*—Pillsbury Winthrop Shaw Pittman, LLP

(57) ABSTRACT

In a disassembling tool and method for disassembling a circuit board from a housing, and in an assembly of a circuit board, a housing and the disassembling tool, the disassembling tool is used to remove the circuit board mounted in the housing. The circuit board has a board edge blocked by a stop protrusion on the housing. The disassembling tool has a rod section, and first and second protrusions projecting radially from the rod section and spaced apart from each other with one on top of the other. The first protrusion of the disassembling tool is used to push the stop protrusion of the housing away from the board edge of the circuit board to free the circuit board from being blocked by the stop protrusion, whereas the second protrusion of the disassembling tool is used to support the circuit board for removing the circuit board from the housing.

18 Claims, 6 Drawing Sheets

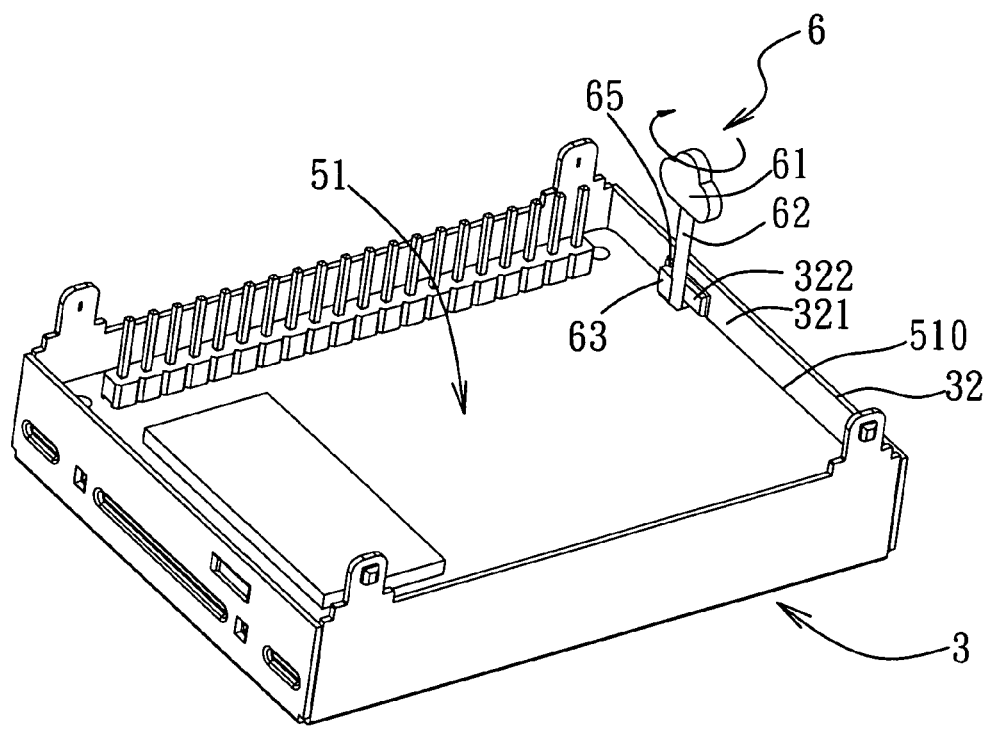
F I G. 4
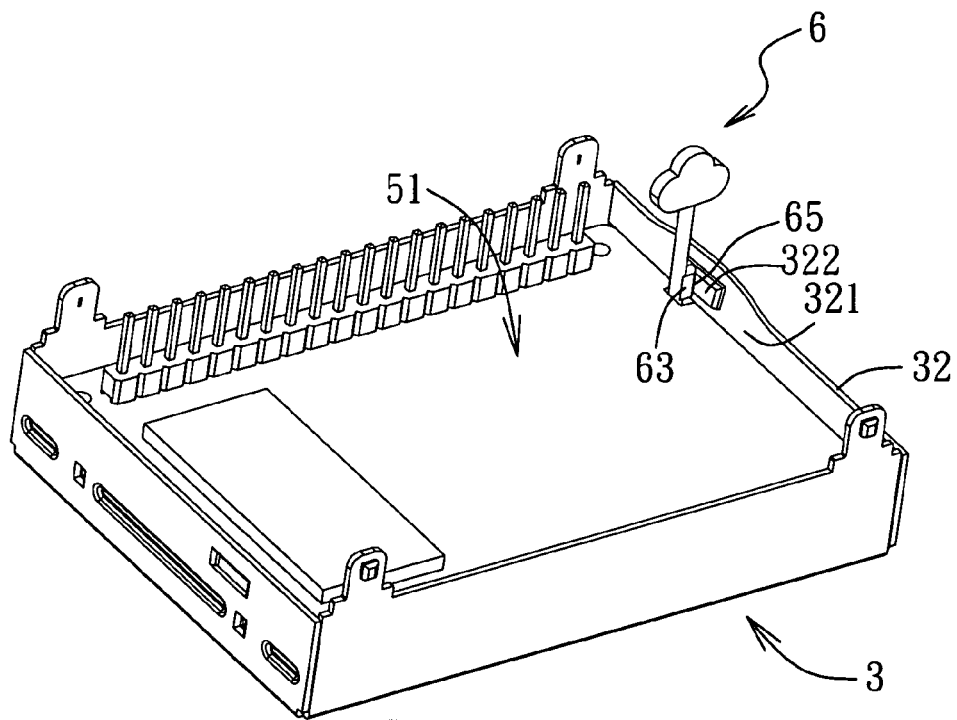
F I G. 5

DISASSEMBLING TOOL AND METHOD FOR DISASSEMBLING A CIRCUIT BOARD FROM A HOUSING, AND ASSEMBLY OF A CIRCUIT BOARD, A HOUSING AND THE DISASSEMBLING TOOL

CROSS-REFERENCE TO RELATED APPLICATION

This application claims priority of Taiwanese Application No. 096147665, filed on Dec. 13, 2007.

BACKGROUND OF THE INVENTION

1. Field of the Invention

The invention relates to a disassembling tool, more particularly to a disassembling tool and method for disassembling a circuit board from a housing, and an assembly of a circuit board, a housing and the disassembling tool.

2. Description of the Related Art

FIG. 1 shows an electronic component module 1 for use in a car stereo satellite receiver. The electronic component module 1 includes a housing 11 and a cover 12 that can be coupled to each other, and a circuit board 13 mounted within the housing 11. The housing 11 is a metal plate bent into a bottom wall 110 and a peripheral wall 111 extending upwardly from a peripheral edge of the bottom wall 110. The peripheral wall 111 has two confronting inner wall surfaces 112 that are respectively provided with stop protrusions 113. The housing 11 permits the circuit board 13 to be accommodated therein, and provides a heat-dissipating effect and an electromagnetic interference shielding effect.

When the circuit board 13 is assembled in the housing 11, opposite board edges of the circuit board 13 are partly blocked by the stop protrusions 113 above. Furthermore, in order for the circuit board 13 to be firmly accommodated in the housing 11, spot welding is conducted at junctions between the stop protrusions 113 and the circuit board 13.

Although spot welding permits firmer positioning of the circuit board 13 in the housing 11, if the assembled circuit board 13 is incorrect or if replacement of the circuit board 13 is desirable, removal of the circuit board 13 from the housing 11 is difficult to conduct since there is a lack of a spot where a removing force can be properly applied. Furthermore, since the housing 11 is generally formed from a metal plate, the thickness of the housing 11 is generally less than 1~2 mm. Therefore, the circuit board 13 is liable to be damaged due to application of an excessive force thereto during removal of the circuit board 13. In a worse scenario, the housing 11 may be deformed to an extent that renders the same unusable after removal of the circuit board 13.

SUMMARY OF THE INVENTION

Therefore, an object of the present invention is to provide a disassembling tool for disassembling a circuit board from a housing, and an assembly of a circuit board, a housing and the disassembling tool, in which possible damage to the housing or over-deformation of the housing during the process of disassembling may be avoided.

Another object of the present invention is to provide a method for disassembling a circuit board from a housing using the disassembling tool.

The disassembling tool for disassembling a circuit board from a housing according to the present invention includes a rod section, and first and second protrusions projecting radially from the rod section and spaced apart from each other with one on top of the other. The first and second protrusions define a non-zero degree angle therebetween with respect to an axis of the rod section.

The housing has a peripheral wall with an inner wall surface, and a stop protrusion projecting from the inner wall surface. The circuit board is mounted in the housing, and has a board edge that is blocked by the stop protrusion. The circuit board is provided with an indentation adjacent to the stop protrusion.

The rod section is adapted to be extended through the indentation in the circuit board and to be rotated axially such that the second protrusion supports a bottom face of the circuit board and the first protrusion pushes the stop protrusion away from the circuit board. The rod section is displaceable upwardly relative to the housing to permit upward movement of the circuit board together with the disassembling tool.

In the disassembling tool for disassembling the circuit board from the housing, the rod section is generally cylindrical, and the first and second protrusions are blocks projecting radially from two diametrically opposite sides of the rod section. The first and second protrusions project from the two diametrically opposite sides of the rod section to define an angle of 180 degrees therebetween with respect to the axis of the rod section.

The method for disassembling the circuit board from the housing using the aforesaid disassembling tool according to the present invention includes the following steps:

(A) extending the rod section through the indentation to a depth such that the second protrusion extends beyond a bottom face of the circuit board;

(B) rotating the rod section axially such that the second protrusion is displaced to a position below the circuit board and the first protrusion pushes the stop protrusion away from an upper portion of the board edge of the circuit board; and (C) displacing the rod section upwardly relative to the housing such that the circuit board is lifted upwardly and outwardly of the housing by virtue of upward movement of the second protrusion.

The assembly of this invention includes a housing, a circuit board, and a disassembling tool. The housing has a peripheral wall with an inner wall surface, and a stop protrusion projecting from the inner wall surface. The circuit board is mounted in the housing, and has a board edge that is blocked by the stop protrusion. The circuit board has an indentation adjacent to the stop protrusion. The disassembling tool has a rod section, and first and second protrusions projecting radially from the rod section and spaced apart from each other with one on top of the other. The first and second protrusions define a non-zero degree angle therebetween with respect to an axis of the rod section.

The configuration of the disassembling tool according to the present invention permits an operator to easily remove the circuit board from the housing without encountering the problem of difficult application of force that is associated with the prior art. In addition, problems that the housing would be damaged due to application of an excessive force thereto by the operator or that the housing would be rendered unusable due to excessive deformation thereof during the process of disassembling are relatively unlikely to occur.

BRIEF DESCRIPTION OF THE DRAWINGS

Other features and advantages of the present invention will become apparent in the following detailed description of the preferred embodiment with reference to the accompanying drawings, of which:

FIG. 4 is a perspective view to illustrate step S1 of extending a rod section of the disassembling tool through an indentation in the circuit board according to the preferred embodiment of the method;

FIG. 5 is a perspective view to illustrate the disassembling tool after being rotated according to step S2 of the preferred embodiment of the method;

DETAILED DESCRIPTION OF THE PREFERRED EMBODIMENT

Figure 1:
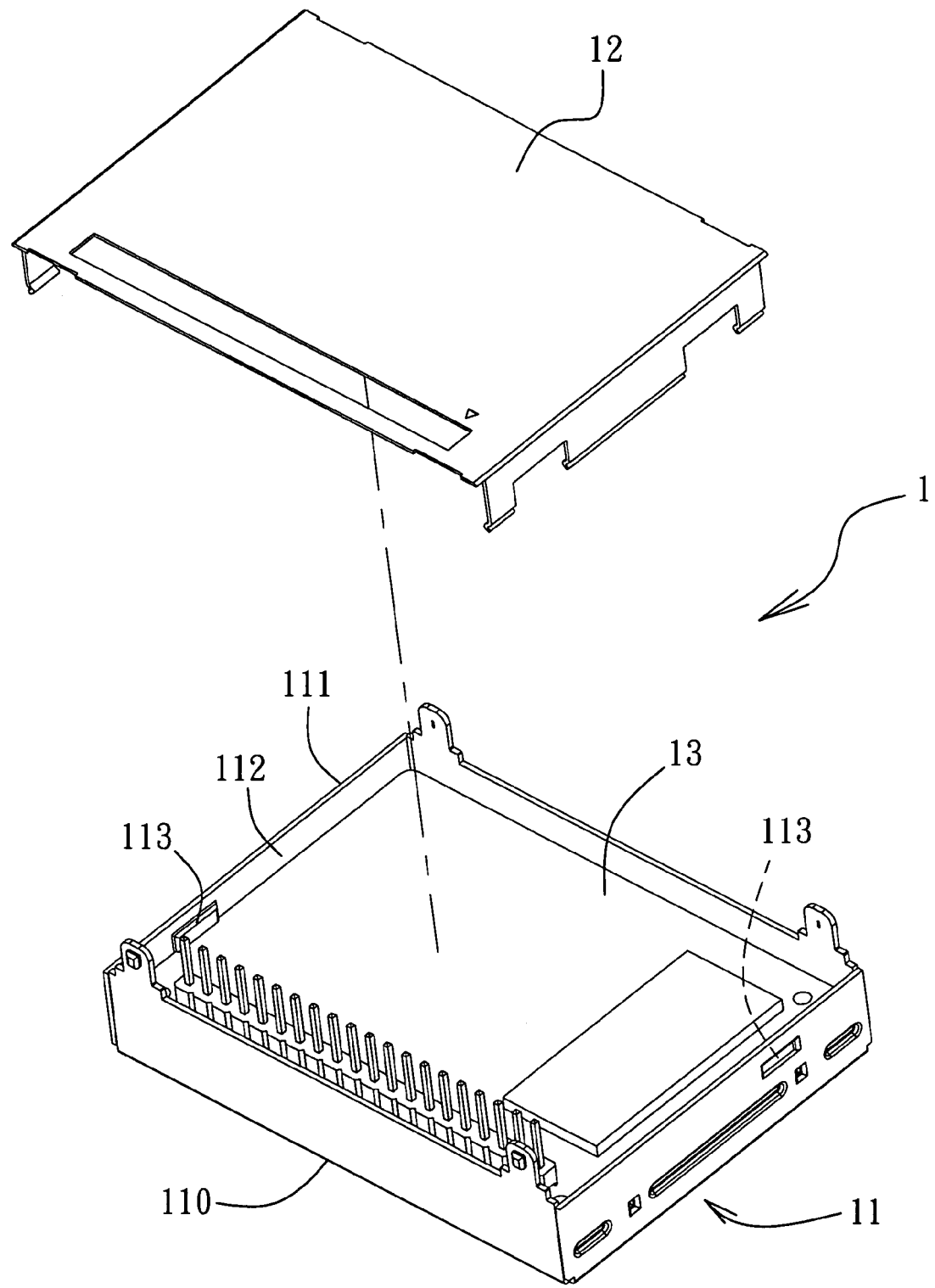
FIG. 1 is a partly exploded perspective view of a conventional electronic component module used in a car stereo satellite receiver.
Figure 2:
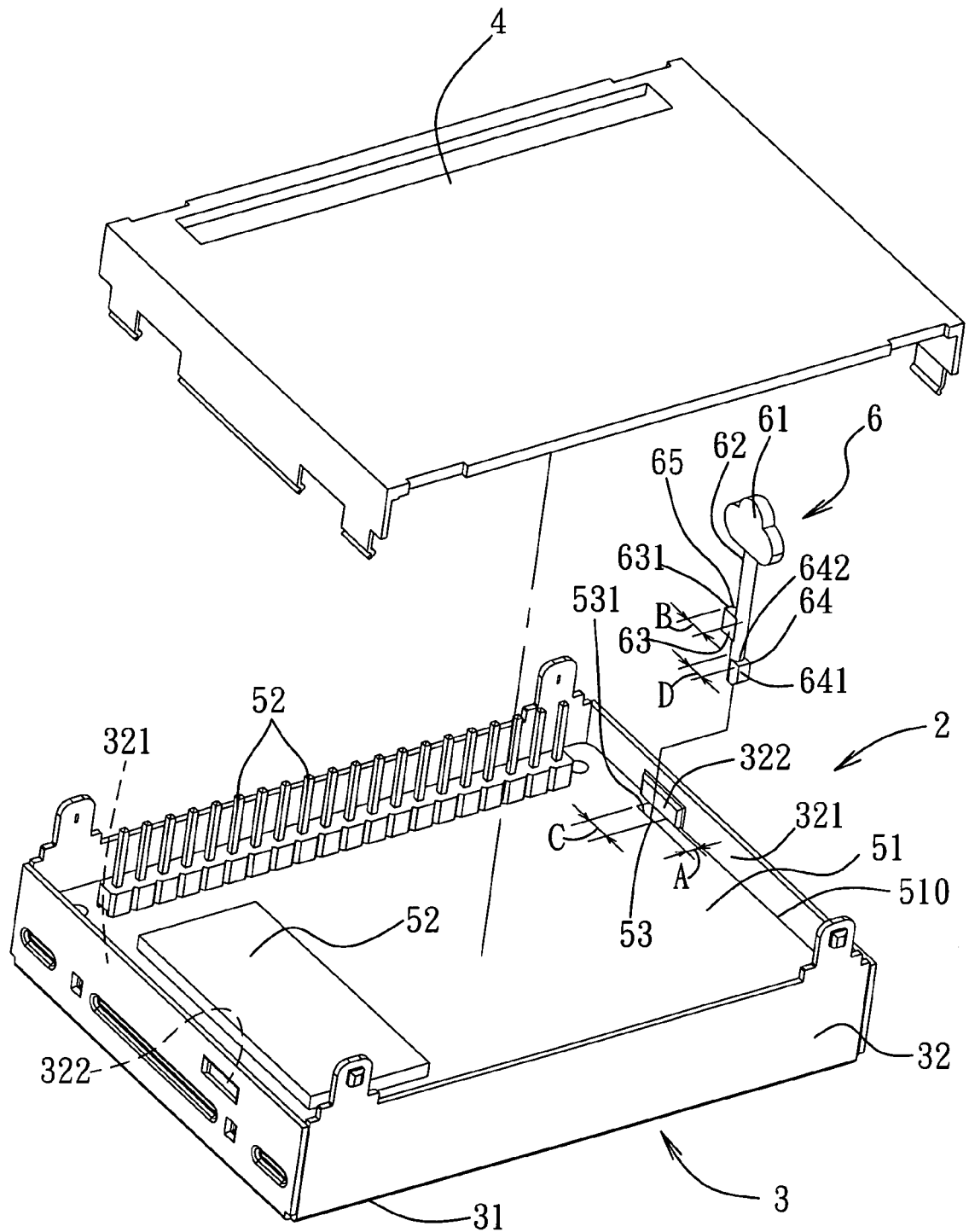
FIG. 2 is a partly exploded perspective view to illustrate a preferred embodiment of a disassembling tool for disassembling a circuit board from a housing according to the present invention, the circuit board, and the housing.

Referring to FIG. 2, a preferred embodiment of a disassembling tool 6 for disassembling a circuit board from a housing according to the present invention is exemplified for application to an electronic component module 2 of a car satellite receiver. The electronic component module 2 includes a housing 3 and a cover 4 that can be coupled together, and a circuit board 51 mounted within the housing 3. The circuit board 51 has electronic components 52, such as a chip, pins, etc., disposed thereon.

Both the housing 3 and the cover 4 are metal plate members and may be formed from cast iron. The housing 3 has a bottom wall 31, a peripheral wall 32 extending upwardly from a periphery of the bottom wall 31, and two stop protrusions 322 respectively provided on two opposite inner wall surfaces 321 of the peripheral wall 32. According to the embodiment, the stop protrusions 322 are formed by punching parts of the peripheral wall 32 from the outside to the inside, so that the corresponding parts of the peripheral wall 32 protrude inwardly. However, it is understood that the stop protrusions 322 may be provided or formed in any other way in other embodiments of the present invention.

The circuit board 51 is provided with two indentations 53 (only one indentation 53 is visible). When the circuit board 51 is disposed in the housing 3, the peripheral wall 32 of the housing 3 surrounds a board edge 510 of the circuit board 51, and the two stop protrusions 322 of the housing 3 are located above the board edge 510 of the circuit board 51 at two opposite sides of the circuit board 51, respectively. The two indentations 53 are respectively disposed adjacent to the two stop protrusions 322. In this embodiment, the indentations 53 are recessed inwardly with respect to the board edge 510 of the circuit board 51. When the circuit board 51 is mounted in the housing 3, each of the indentations 53 partly corresponds to a lower portion of an adjacent one of the stop protrusions 322 and is partly accessible therefrom.

In this embodiment, each of the indentations 53 has an inner edge 531. When the circuit board 51 is mounted in the housing 3, the inner edge 531 is spaced a certain distance apart from the corresponding stop protrusion 322. A horizontal distance from the inner edge 531 to the respective stop protrusion 322 is defined as (A), and the indentation 53 is defined to have a width (C).

The disassembling tool 6 has an operating portion 61, a rod section 62, a first protrusion 63, and a second protrusion 64. The operating portion 61 is in the form of a plate, is connected to a top end of the rod section 62, and is adapted for gripping and manipulation by a user. The rod section 62 is in the form of a cylindrical rod. The first and second protrusions 63, 64 project outwardly and radially from an outer peripheral surface of the rod section 62, and are spaced apart from each other with one above the other. In this embodiment, the first and second protrusions 63, 64 are in the form of rectangular blocks. The second protrusion 64 is disposed closer to a bottom end of the rod section 62 than the first protrusion 63. The first and second protrusion 63, 64 define a non-zero degree angle. In this embodiment, the first and second protrusions 63, 64 project outwardly and radially from two diametrically opposite sides of the outer peripheral surface of the rod section 62 to define an angle of about 180 degrees therebetween with respect to the axis of the rod section 62.

The first protrusion 63 has a first end face 631 distal from the rod section 62. A radial distance from the first end face 631 of the first protrusion 63 to one side of the rod section 62 where the second protrusion 64 is provided is defined as (B). The radial distance (B) is longer than the horizontal distance (A) (i.e., the distance from the inner edge 531 to the stop protrusion 322). One side of the first protrusion 63 is further provided with a chamfer 65, which will be described in detail hereinafter.

The second protrusion 64 has a second end face 641 distal from the rod section 62, and a top face 642. A horizontal distance from the second end face 641 of the second protrusion 64 to the other side of the rod section 62 where the first protrusion 63 is provided is defined as (D). The width (C) of the indentation 53 is at least equal to or greater than the horizontal distance (D).

Figure 3:
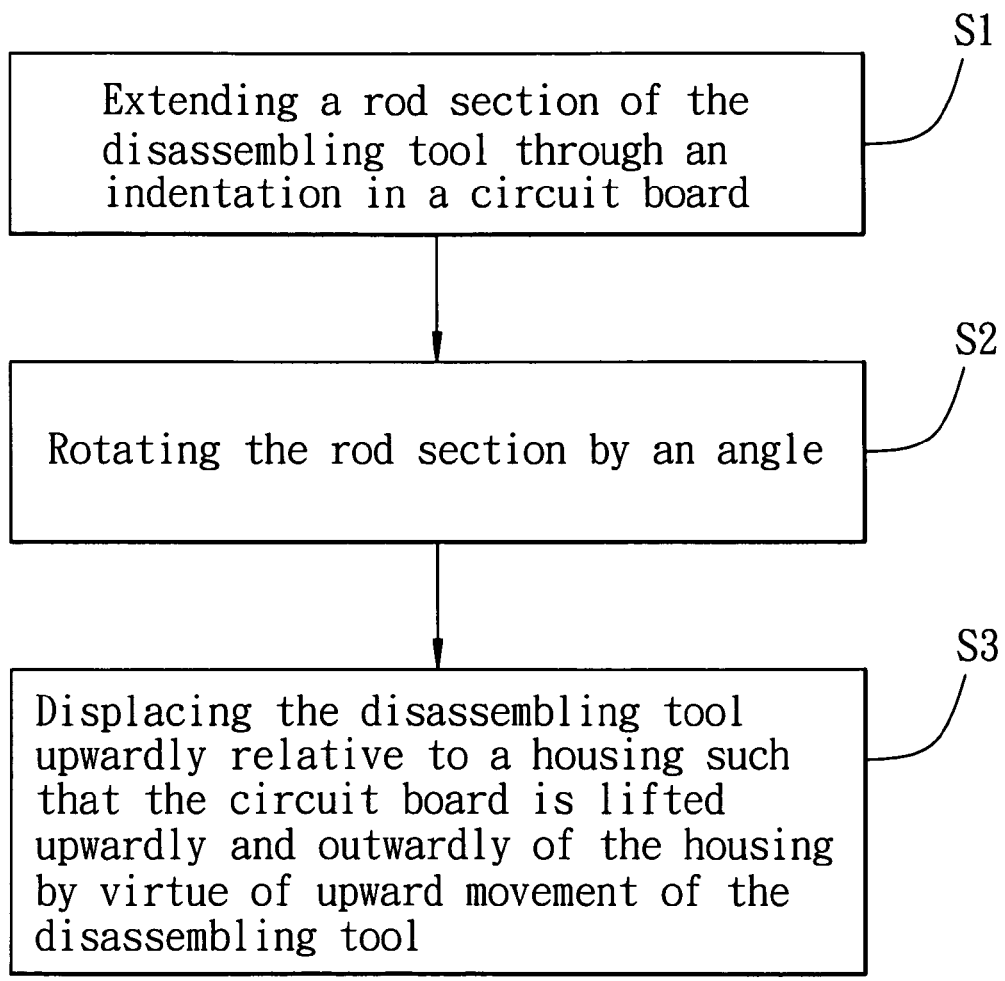
FIG. 3 is a flowchart to illustrate steps of a preferred embodiment of a method for disassembling a circuit board from a housing according to the present invention.

Referring to FIG. 3, a preferred embodiment of a method for disassembling a circuit board from a housing according to the present invention includes the following steps.

With reference to FIGS. 2 and 4, in step S1, the rod section 62 is extended through the indentation 53. Before the rod section 62 is extended through the indentation 53, the disassembling tool 6 is gripped in such a way that the first protrusion 63 faces rearwardly and the second protrusion 64 faces forwardly, so that the side of the first protrusion 63 provided with the chamfer 65 faces toward the stop protrusion 322. The rod section 62 is extended to a depth such that the second protrusion 64 extends beyond a bottom face of the circuit board 51 (as shown in FIG. 6), and the first protrusion 63 and the corresponding stop protrusion 322 are substantially at the same height.

Figure 6:
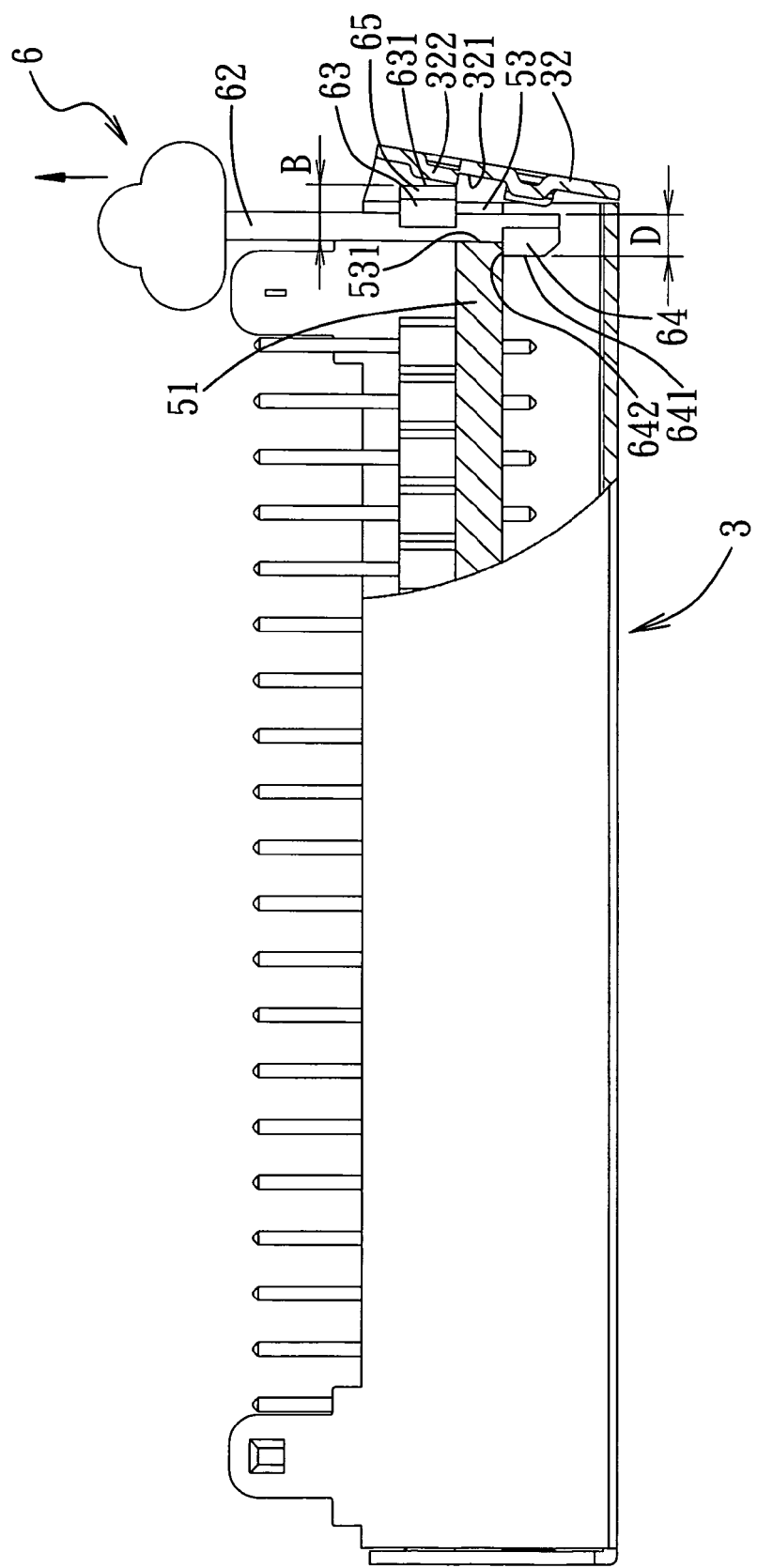
FIG. 6 is a schematic partly sectional view to illustrate the housing and the circuit board after rotating the disassembling tool according to step S2 of the preferred embodiment of the method.

Referring to FIGS. 5 and 6, in step S2, the rod section 62 is rotated axially by an angle such that the second protrusion 64 is displaced to a position immediately below the circuit board 51, and such that the corresponding stop protrusion 322 is pushed away from an upper portion of the board edge 510 of the circuit board 51 by the first protrusion 63. In this embodiment, the rod section 62 is rotated by about 90 degrees and in a direction such that the first protrusion 63 approaches the corresponding stop protrusion 322 while the second protrusion 64 moves away from the inner wall surface 321 of the peripheral wall 32, thereby enabling the second protrusion 64 to be displaced to the position below the bottom face of the circuit board 51. The first protrusion 63 may then come into contact with the stop protrusion 322. Furthermore, during the process of rotating the rod section 62, since the radial distance (B) from the first end face 631 of the first protrusion 63 to the side of the rod section 62 where the second protrusion 64 is provided is greater than the horizontal distance (A) from the inner edge 531 of the indentation 53 to the corresponding stop protrusion 322 (see FIG. 2), the side of the rod section 62 provided with the second protrusion 64 abuts against the inner edge 531 of the indentation 53, and the first protrusion 63 pushes the corresponding stop protrusion 322 gradually outward, such that the part of the peripheral wall 32 around the corresponding stop protrusion 322 is gradually and slightly deformed in an outward direction, whereby the corresponding stop protrusion 322 is pushed away from the board edge 510 of the circuit board 51 by the first protrusion 63.

Therefore, the main purpose of step S2 is to push the stop protrusion 322 blocking an upper portion of the board edge 510 of the circuit board 51 away from the board edge 510 of the circuit board 51 for disabling blocking of the circuit board 51 by the stop protrusion 322. The chamfer 65 on one side of the first protrusion 63 serves to guide the first protrusion 63 to push the stop protrusion 322 gradually outward during the process of axial turning of the rod section 62 and to facilitate application of force to the rod section 62 to axially rotate the same.

Figure 7:
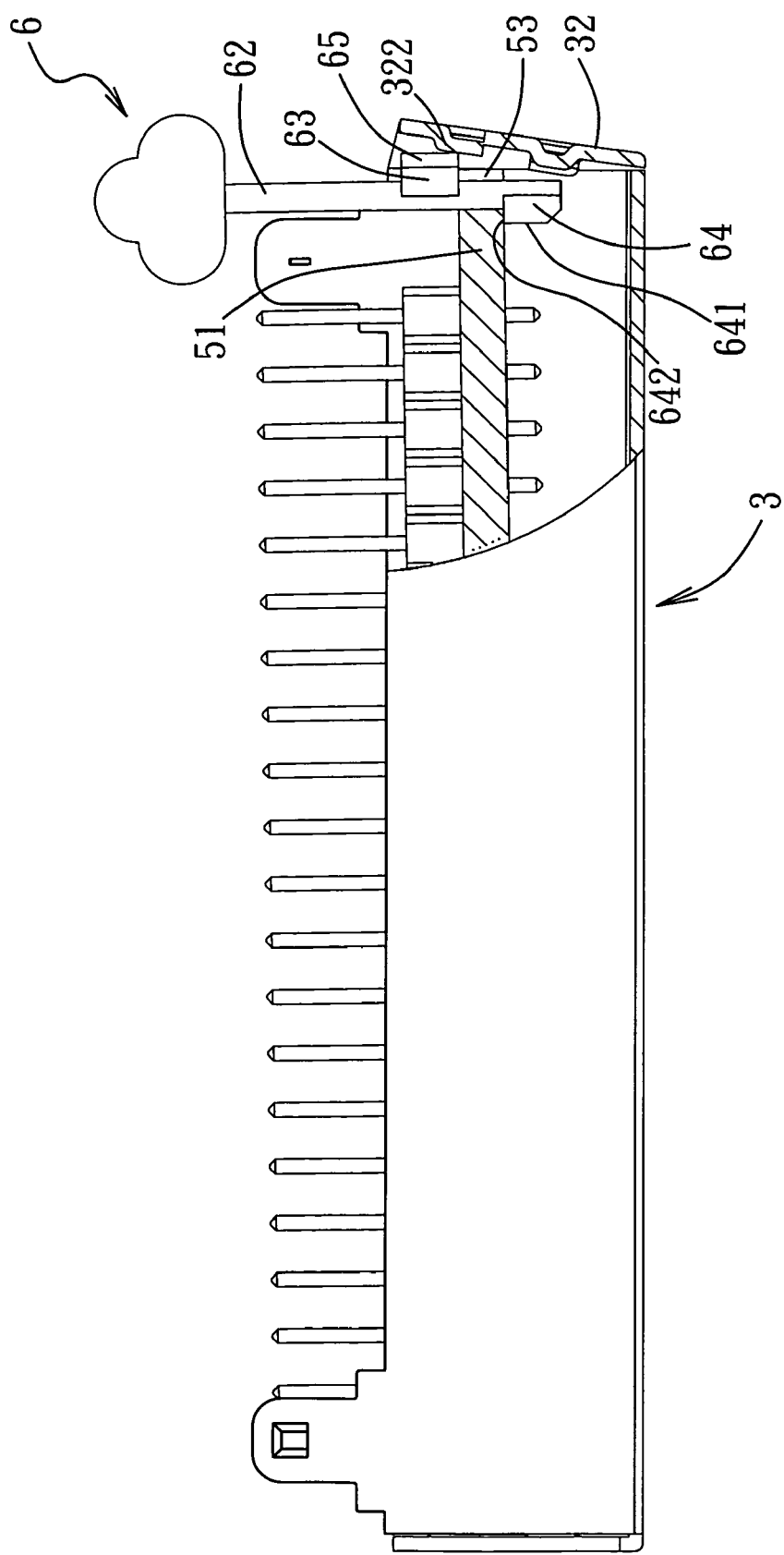
FIG. 7 is a schematic partly sectional view to illustrate how the circuit board is lifted upward according to step S3 of the preferred embodiment of the method.

Referring to FIGS. 6 and 7, in step S3, the rod section 62 is displaced upwardly relative to the housing 3 for removing the circuit board 51 from the housing 3. Since the second protrusion 64 has been displaced to the position below the circuit board 51 in step S2, and since the board edge 510 of the circuit board 51 is no longer blocked by the stop protrusion 322, by pulling the rod section 62 upwardly relative to the housing 3 at this juncture, the circuit board 51 can be lifted upwardly relative to the housing 3 since the circuit board 51 is supported on the top face 642 of the second protrusion 64, so that the circuit board 51 can be removed from the housing 3. Thereafter, with the upward movement of the first protrusion 63, the part of the peripheral wall 32 around the stop protrusion 322 may be elastically restored to the state prior to being pushed outward from the board edge 510 of the circuit board 51, as shown in FIG. 4.

It is noted that, in this embodiment, the first and second protrusions 63, 64 project respectively from the two diametrically opposite sides of the rod section 62 and define an angle of 180 degrees therebetween with respect to the axis of the rod section 62. Therefore, in step S2, the rod section 62 is rotated by an angle of about 90 degrees. Certainly, the angle of rotation of the rod section 62 depends on the angle between the first and second protrusions 63, 64 and the shape of the indentation 53, and it is necessary that, when the stop protrusion 322 is being pushed outward by the first protrusion 63, a portion of the second protrusion 64 is still below the bottom face of the circuit board 51 and can be used to support the circuit board 51 so as to lift the circuit board 51 away from the housing 3.

In sum, by providing the indentations 53 in the circuit board 51, and by using the disassembling tool 6, the present invention permits an operator to easily remove the circuit board 51 from the housing 3 without encountering the problem of difficult application of force that is associated with the prior art. In addition, during the process of disassembling, problems that the housing 3 would be damaged due to application of an excessive force by the operator or that the housing 3 would be rendered unusable due to excessive deformation thereof are relatively unlikely to occur.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements. In addition, the abstract and title of the disclosure are provided for the mere purpose of facilitating patent searching and should not be based upon to limit the scope of the present invention.

I claim:

1. A disassembling tool for disassembling a circuit board from a housing, the housing having a peripheral wall with an inner wall surface, and a stop protrusion provided on and projecting from the inner wall surface, the circuit board being mounted in the housing and having a board edge blocked by said stop protrusion, the circuit board being provided with an indentation adjacent to the stop protrusion, said disassembling tool comprising:

a rod section;

a first protrusion projecting radially from said rod section; and a second protrusion projecting radially from said rod section and spaced apart from and disposed below said first protrusion, said second protrusion and said first protrusion defining a non-zero degree angle therebetween with respect to an axis of said rod section;

wherein said rod section is adapted to be extended through the indentation in the circuit board to be rotated axially such that said second protrusion supports a bottom face of the circuit board and said first protrusion pushes the stop protrusion away from the circuit board, said rod section being displaceable upwardly relative to the housing to permit upward movement of the circuit board together with said disassembling tool.

2. The disassembling tool for disassembling a circuit board from a housing according to claim 1, wherein said first and second protrusions project radially and respectively from two diametrically opposite sides of said rod section.

3. The disassembling tool for disassembling a circuit board from a housing according to claim 2, wherein said first and second protrusions are respectively blocks that projecting radially and respectively from the two diametrically opposite sides of said rod section.

4. The disassembling tool for disassembling a circuit board from a housing according to claim 3, wherein said first protrusion is provided with a chamfer at one side thereof.

5. The disassembling tool for disassembling a circuit board from a housing according to claim 2, wherein the indentation is recessed inwardly from the board edge of the circuit board and partly corresponds to a lower portion of the stop protrusion so as to be partly accessible therefrom.

6. The disassembling tool for disassembling a circuit board from a housing according to claim 5, wherein the indentation has an inner edge spaced apart from the stop protrusion, said first protrusion having a first end face distal from said rod section, a horizontal distance from the inner edge of the indentation to the stop protrusion being shorter than a radial distance from said first end face to one side of said rod section that is provided with said second protrusion.

7. The disassembling tool for disassembling a circuit board from a housing according to claim 3, wherein said second protrusion has a top face adapted for supporting the bottom face of the circuit board.

8. A method for disassembling a circuit board from a housing, said method being implemented using a disassembling tool, the disassembling tool including a rod section and first and second protrusions projecting radially from the rod section and spaced apart from each other with one on top of the other, the circuit board being mounted in the housing and having a board edge blocked by a stop protrusion of the housing, the circuit board being provided with an indentation adjacent to the stop protrusion, said method comprising:

(A) extending the rod section through the indentation;

(B) rotating the rod section axially such that the second protrusion is displaced to a position below the circuit board and the first protrusion pushes the stop protrusion away from the board edge of the circuit board; and (C) displacing the rod section upwardly relative to the housing such that the circuit board is lifted upwardly and outwardly of the housing by virtue of upward movement of the second protrusion.

9. The method for disassembling a circuit board from a housing according to claim 8, wherein, in step (A), the rod section is extended through the indentation to a depth such that said second protrusion extends beyond a bottom face of the circuit board.

10. The method for disassembling a circuit board from a housing according to claim 8, wherein, in step (B), the rod section is rotated axially by about 90 degrees.

11. An assembly of a circuit board, a housing and a disassembling tool, comprising:

a housing having a peripheral wall with an inner wall surface, and a stop protrusion projecting from said inner wall surface;

a circuit board mounted in said housing and having a board edge that is blocked by said stop protrusion, said circuit board having an indentation disposed adjacent to said stop protrusion; and a disassembling tool having
a rod section,
a first protrusion projecting radially from said rod section, and
a second protrusion projecting radially from said rod section and spaced apart from and disposed below said first protrusion, said second protrusion and said first protrusion defining a non-zero degree angle therebetween with respect to an axis of said rod section;

wherein said rod section is extended through said indentation in said circuit board and is rotated axially such that said second protrusion supports a bottom face of said circuit board and said first protrusion pushes said stop protrusion away from said circuit board, said rod section being displaceable upwardly relative to said housing to permit upward movement of said circuit board together with said disassembling tool.

12. The assembly of a circuit board, a housing and a disassembling tool according to claim 11, wherein said first and second protrusions project radially and respectively from two diametrically opposite sides of said rod section.

13. The assembly of a circuit board, a housing and a disassembling tool according to claim 12, wherein said rod section is generally cylindrical, and said first and second protrusions are blocks that project radially and respectively from the two diametrically opposite sides of said rod section.

14. The assembly of a circuit board, a housing and a disassembling tool according to claim 13, wherein said first protrusion is provided with a chamfer at one side thereof.

15. The assembly of a circuit board, a housing and a disassembling tool according to claim 12, wherein said indentation is recessed inwardly from said board edge of said circuit board, and partly corresponds to a lower portion of said stop protrusion so as to be partly accessible therefrom.

16. The assembly of a circuit board, a housing and a disassembling tool according to claim 15, wherein said indentation has an inner edge spaced apart from said stop protrusion, said first protrusion having a first end face distal from said rod section, a horizontal distance from said inner edge of said indentation to said stop protrusion being shorter than a radial distance from said first end face to one side of said rod section that is provided with said second protrusion.

17. The assembly of a circuit board, a housing and a disassembling tool according to claim 13, wherein said second protrusion has a top face for supporting said bottom face of said circuit board.

18. The assembly of a circuit board, a housing and a disassembling tool according to claim 11, wherein said housing is a metal plate and further has a bottom wall with a peripheral edge, said peripheral wall extending upwardly from said peripheral edge of said bottom wall.

* * * * *